United States Patent [19]

Mosher et al.

[11] Patent Number: 5,185,654

[45] Date of Patent: Feb. 9, 1993

[54] ELECTROSTATIC RF ABSORBANT CIRCUIT CARRIER ASSEMBLY AND METHOD FOR MAKING THE SAME

[75] Inventors: Mark D. Mosher, Scottsdale; Robert Fraser, Tempe; Ronald D. Fuller, Mesa, all of Ariz.

[73] Assignee: Motorola, Inc., Schaumburg, Ill.

[21] Appl. No.: 799,235

[22] Filed: Nov. 27, 1991

[51] Int. Cl.$^5$ .............................................. H05B 6/60
[52] U.S. Cl. ................................... 257/659; 257/660; 257/704; 257/678
[58] Field of Search ............................. 357/74, 80, 81

[56] References Cited

U.S. PATENT DOCUMENTS

| 4,379,098 | 4/1983 | Gumienny | 264/24 |
| 5,045,820 | 9/1991 | Leicht et al. | 333/26 |

OTHER PUBLICATIONS

The Technical Bulletin T.B. 2-6, "Machinable Rod, Bar and Sheet Stock With Lossy Magnetic Loading", by Emerson & Cuming, Inc., Woburn, Mass., Apr. 1982.
The Technical Bulletin T.B. 2-6A, "High Temperature Magnetic Type Waveguide Absorber", by Emerson & Cuming, Inc., Woburn, Mass. revised Feb. 1976.
The Technical Bulletin T.B. 2-6B, "High-Loss Silicone Rubber Dielectric for Microwave Transmission Lines", by Emerson & Cuming, Inc., Woburn, Mass., May 1979.
The Technical Bulletin T.B. 2-13, "A Series of Castable Absorbers for Waveguides", by Emerson & Cuming, Inc., Woburn, Mass., revised Nov. 1973.
The Technical Bulletin T.B. 2-13A, "High-Loss, Castable RTV Silicone for Microwave Transmission Lines", by Emerson & Cuming, Inc., Woburn, Mass. rev. May 1979.
The Technical Bulletin T.B. 2-13B, "High-Loss Castable Silicone Rubber", by Emerson & Cuming, Inc., Woburn, Mass., revised Aug. 1977.
The Technical Bulletin T.B. 2-13C, "Castable Polyurethane, High Magnetic Loss Dielectric", by Emerson & Cuming, Inc., Woburn, Mass., May 1978.
The Technical Bulletin T.B. 4-2-14B, "Carbon Based Lacquers", by Emerson & Cuming, Inc., Woburn, Mass., revised Feb. 1975.
The Technical Bulletin T.B. 11-2-16, "Conductive Foam for Packaging Solid State Devices", by Emerson & Cuming, Inc., Woburn, Mass., Mar. 1977.
The Technical Bulletin T.B. 11-10B, "Conductive Silicone Rubber Sheet", by Emerson & Cuming, Inc., Woburn, Mass., Apr. 1975.
The Technical Bulletin T.B. 11-10L, "Highly Conductive Silicone Elastomer Filled with Silver Plated Copper Particles", by Emerson & Cuming, Inc., Woburn, Mass., Jul 1985.
The Technical Bulletin T.B. 11-10M, "Highly Conductive Silicone Elastomer Filled with Silver Particles", by Emerson & Cuming, Inc., Woburn, Mass., Feb. 1984.
The Technical Bulletin T.B. 11-10N, "Highly Conductive Silicone Elastomer Filled with Silver Plated Nickel Particles", by Emerson & Cuming, Inc., Woburn, Mass., Feb. 1984.
The Technical Bulletin T.B. 11-10P, "Highly Conductive Silicone Elastomer Filled with Silver Particles", by Emerson & Cuming, Inc., Woburn, Mass., Feb. 1984.
The Thesis "Packaging Gallium Arsenide Monolithic Microwave Integrated Circuits: Considerations, Techniques and Solutions", by Douglas J. Mathews, Arizona State University, May 1989.

*Primary Examiner*—Joseph A. Popek
*Assistant Examiner*—Viet Q. Nguyen
*Attorney, Agent, or Firm*—Val Jean F. Hillman

[57] ABSTRACT

An electrostatic RF absorbant circuit carrier assembly (200) is described as having a plastic support structure (100) which consists of an integrally fashioned base (180) and surrounding sidewalls (170) which together form an internal cavity (185). A plurality of conductor paths (125,165) are disposed within the cavity (185). The assembly (200) is completed by a polymeric cover (110) having a surface integrally fashioned to comprise wall members (145) for making contact with conductive paths (165) within the cavity (185). In order to facilitate RF isolation and electrostatic dissipation, the cover (110) is layered with a surface material comprising:
a thermosetting matrix system;
a non-conductive RF absorbing filler comprising 25 to 87 percent by weight loading of the thermosetting matrix system; and
a conductive filler comprising 1 to 4 percent by weight loading of the thermosetting matrix system and the RF absorbing filler.

14 Claims, 1 Drawing Sheet

ELECTROSTATIC RF ABSORBANT CIRCUIT CARRIER ASSEMBLY AND METHOD FOR MAKING THE SAME

FIELD OF THE INVENTION

This invention relates generally to circuit carrier assemblies (packages) and more specifically to circuit and device carriers for microwave applications.

BACKGROUND OF THE INVENTION

The current trend by a growing number of gallium arsenide (GaAs) chip makers is to supply low cost, high performance analog and digital integrated circuits (ICs) capable of operating in the 1–60 gigahertz (GHz) frequency range. To take full advantage of this new and exciting semiconductor technology, there is a desperate need for packaging and packaging mass production assembly techniques which will permit system designers to efficiently translate GaAs device performance to a systems level.

Early microwave chip carriers (MCCs) and monolithic microwave integrated circuit (MMICs) packages were fashioned after the ceramic packages utilized by the silicon technology. Unfortunately, these hermetically sealed enclosures exhibited poor impedance matching, high insertion loss and low RF isolation, as well as seal ring and cavity resonance during microwave operations. As a result, system designers were forced to seek alternative packaging approaches. As an outline, the interested reader is encouraged to review the suggestions highlighted in the following articles:

1.) D. E. Heckman, et al. "Microwave Chip Carrier for Monolithic Integrated Circuits," IEEE GaAs IC Symposium, pp 155-158, 1985;

2.) B. A. Ziegner, "High Performance MMIC Hermetic Packaging," Microwave Journal, vol.29, no.11., pp. 133-139, November 1986;

3.) R. S. Pengelly and P. Schmacher, "High Performance 20 GHz Package for GaAs MMICs," Microwave systems News, vol.18, no.1, pp. 10-19, January 1988;

4.) J. A. Frisco, D. A. Haskins, D. E. Heckman, D. A. Larson, "Low Cost T.O. Packages for High Speed/Microwave Applications", in 1986 IEEE MTT-S Int. Microwave Symposium Digest, June 1986, pp. 437-440; and 5.) J. Cook, "System Level Considerations for Microwave/Millimeter Wave Packaging", GaAs IC Packaging Short Course, IEEE GaAs IC Symposium, Nov. 6, 1988.

The work accomplished by these microwave design teams has given the industry a number of techniques by which MMIC packages can be designed. Unfortunately, these packages comprise expensive custom assemblies which are unsuitable for mass-production or wide scale industry integration.

In most cases, ceramic still comprises the primary substrate material for the MMIC package due to its dielectric properties, thermal expansion properties and ability to host thin film (or thick film) hybrid circuitry. These properties aid in reducing transmission line losses and allow line widths to be readily varied. These devices are typically characterized by a machined metal cavity and an associated metal coaxial cable for providing a hermetically sealed enclosure.

Notwithstanding, RF isolation remains a critical design problem with ceramic GaAs MMIC packages. Controlling RF isolation is a matter of controlling the mechanisms by which a signal on one path is coupled to another path in the package. This problem is accentuated when signal frequencies of 12 GHz or higher are routed along parallel line patterns. While it is appreciated that the ideal solution requires placing a conductive wall between each signal path, ceramic's inability to be readily molded for customized designs and its high cost serve as barriers to the realization of a commercially mass-producible microwave device package. From the foregoing discussion it should be evident that existing microwave device carriers suffer in economy and performance due to the types of materials used (primarily ceramic), the type of transitions needed, and the number of piece parts needed to form a hermetic package.

Recent developments in the Polymer technology have resulted in the use of plastics as circuit carriers for sub-microwave frequency applications. Molded "three dimensional" printed circuits are known only for low frequency applications. Printed circuits are considered "three dimensional" when the substrate comprises a surface variation in at least one dimension.

These molded circuit carriers are plastic and are formed by injection molding, extrusion or other conventional thermoplastic fabrication processes. Therefore, they may be shaped to avoid or adapt to physical constraints in a specific application. Patterns of conductors are metallized to predetermined surfaces of the substrate and serve as circuit traces and bonding paths for circuit components. Once components are fixed, it becomes a multi-device carrier.

Plastic is generally characterized as a high loss, non-hermetic material and has not traditionally found use as a material in the microwave carrier design. In addition to providing poor RF isolation, plastic typically possesses poor electrostatic dissipation (ESD) properties. Notwithstanding, it would be extremely advantageous to provide a high frequency electrostatic RF attenuating circuit carrier assembly which overcomes the above cited short comings.

SUMMARY OF THE INVENTION

Briefly described, the present invention is an electrostatic RF absorbant circuit carrier assembly and method for making the same. In this effort, a polymeric support structure is fashioned to have a base and surrounding sidewalls which together form an internal cavity. A plurality of conductor paths are disposed within the cavity. The assembly is completed by a polymeric cover having a surface integrally fashioned to comprise wall members for making contact with conductor paths within the cavity. In order to facilitate RF isolation and electrostatic dissipation, the cover is layered with a surface material comprising:

a thermosetting binder;

a non-conductive RF absorbing filler comprising 25–87% (percent) by weight loading of the binder, such that the surface material absorbs RF energy within a range between 1–60 GHz; and a conductive filler comprising 1–4% (percent) by weight loading of the binder and the RF absorbing filler, such that the surface material has a surface resistivity of between $10^5$–$10^{12}$ ohms/square.

DETAILED DESCRIPTION OF THE PREFERRED EMBODIMENT

Figure 1:
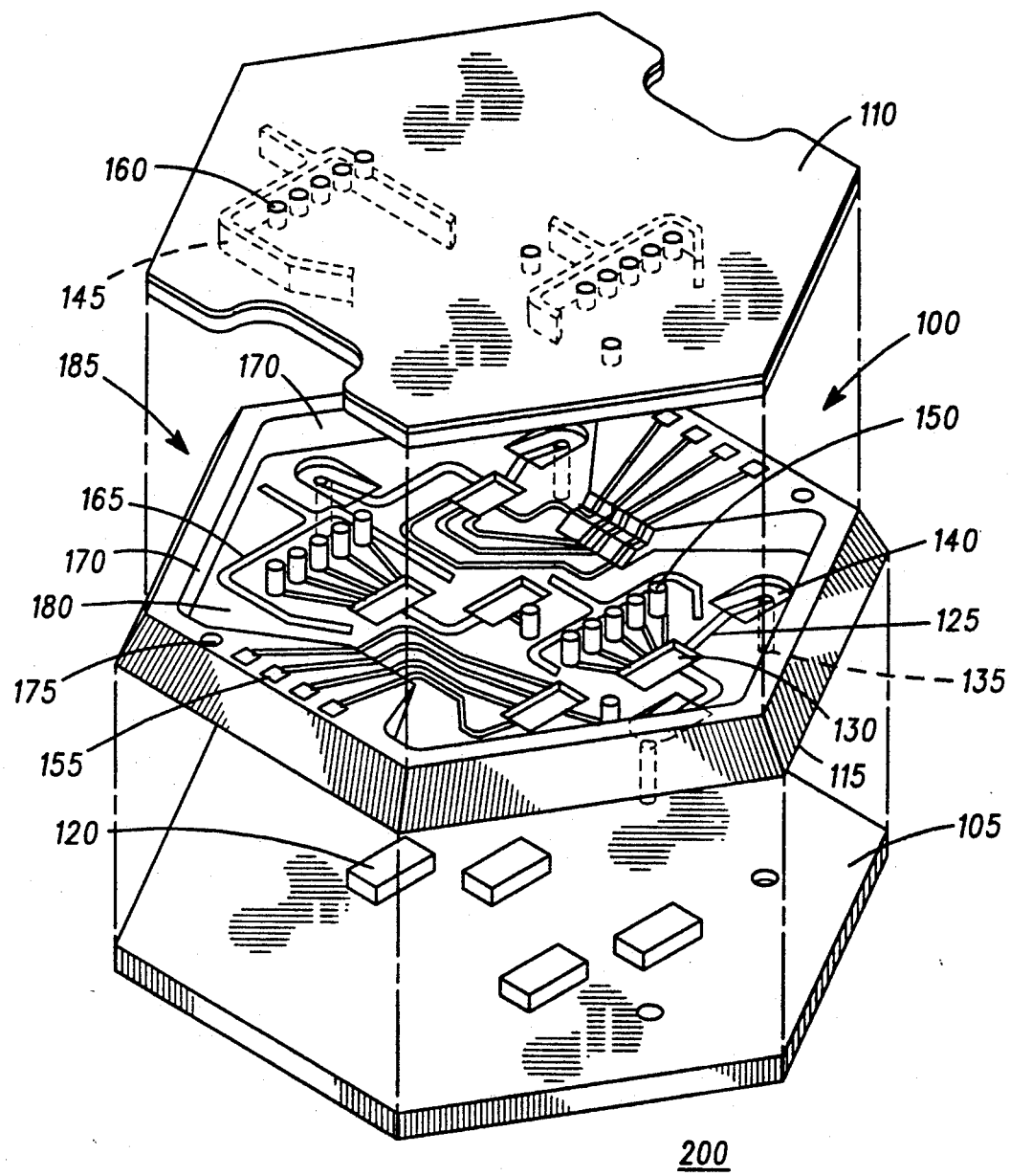
FIG. 1 depicts an exploded view of the circuit carrier assembly including the support structure and the cover in accordance with the present invention.

The invention, as set forth in the exploded view of FIG. 1, is comprised of a plated injected molded, three dimensional support structure (100), a metal back plate (105), and an injection molded cover (110). The support structure (100) comprises a base (180) and integrally fashioned sidewalls (170) which together form a cavity (185). A final assembly of these components forms a customized, low cost, non-hermetic GaAs MMIC circuit carrier assembly (200) for commercial use. In accordance with the present invention, the circuit carrier assembly (200) is RF absorbant within a range between 1–60 GHz and has a surface resistivity between $10^5$–$10^{12}$ ohms/square or a volume resistivity between $10^4$–$10^{10}$ ohms-cm, which provides protection from electrostatic energy surges up to 10,000 volts.

The support structure (100) is injection molded or extruded into a three dimensional shape from plastic. Suggested compounds comprise amorphous thermoplastics, such as but not limited to, Polycarbonate, Polystyrene, and Polyetherimide; and crystalline thermoplastics such as, but not limited to, Polypropylene, modified Polypheneylene, and nylon. According to the preferred embodiment, the support structure (100) is made from a Polyetherimide plastic, such as "Ultem" available from General Electric. This plastic is a low-loss type having a suitable dielectric constant for high frequency microwave applications. As understood in the art, a non-hermetic package will result from the use of plastic.

Generally, as depicted in FIG. 1, the top surface of the base (180) of the support structure (100) is characterized by receiving holes (130) for mounting a multiple number of MMIC chips (120), along with plated circuit traces (125) which provide circuit interconnects. The underside surface (115) of the support structure (100) is entirely plated, providing a ground plane in addition to electromagnetic interference (EMI) and radio frequency interference (RFI) shielding. The combination of the traces (125) and the ground plane (115) form transmission line for microwave energy.

Plated through holed (175) selectively bring the ground plane to the top surface of the base (180), thereby modifying its shape, enlarging its surface area, and providing easier access for top side interconnect. Other methods of providing grounding for the MMIC chips (120) may be employed where appropriate. An embodiment of the invention providing locations for mounting low power devices directly to a surface of the plated substrate (using such methods as conductive adhesive epoxy or any other suitable attachment and interconnect method) further exploits the inventor's design as a circuit and device carrier.

Wave guide couplers (135) are integrally fashioned as a part of the support structure (100) and are plated through conical-shaped members as taught by U.S. Pat. No. 5,045,820, assigned to the assignee of the present invention and incorporated herein by reference.

The MMIC chips (120) are attached to the metal back plate (105) via an electrically and thermally conductive adhesive disposed on the top surface of the back plate (105). The back plane (105) serves as a heat sink and ground plane for the MMIC chips (120). Metal alloys or other suitable materials capable of acting either as a heat sink or a ground plane or both may be used. It further comprises expansion properties appropriate for die mounting the GaAs chips (120). Electrically conductive adhesive thermally and electrically connects the back plane (105) to the plated underside (115) of the support structure (100), decreasing ground plane resistance to enhance electrical performance. A plated underside (115) may not be necessary if sufficient shielding and grounding is provided by other suitable means.

The MMIC chips (120) are electrically wire bonded directly to the conductive paths (125) associated with a particular MMIC. Surface mount electrical interconnections from the MMIC chips (120) (or any other on carrier components) to an off carrier object, are facilitated by the integral molded plated posts (150) and circuit pads (155) located throughout the cavity (185) of the support structure (100). The plated posts (150) extend through holes (160) in the cover (110), thereby providing electrical contact surfaces on the top of the cover (110). Other types of surface mount and non-surface mount interconnections, such as direct wire bonds, may provide versatile carrier interconnect combinations.

In accordance with the present invention, the molded plastic cover (110) comprises integrally fashioned walls (145) and previously mentioned holes (160) for receiving the posts (150) of the support structure (100). Applying the cover (110) to the support structure (100) causes the walls (145) to extend into the cavity (185) and make contact with conductive paths (165). Conductive paths (165) are connected to the back plate (105) and are therefore grounded. When the plastic cover (110) is fixed to the support structure (100) such that the cavity (185) is sealed, isolation zones (190) are formed around the MMIC chips (120), thereby reducing radiated energy emissions and limiting EMI and RFI. The cover (110) is fixed to the support structure (100) via posts (150) and holes (160), or any other suitable coupling method such as, but not limited to welding, adhering, fusing or fastening.

As previously suggested, the support structure (100) and the cover (110) are made from a plastic and are producible utilizing various thermoplastic fabrication techniques. For additional discussion on state of the art, the interested reader may refer to: Dubois, H. J., Pribble, W. I., "Plastics Mold Engineering Handbook," 3rd Edition Van Nostrund Reinhold Company, New York 1978. Since plastic is used to provide the microwave circuit carrier assembly (200), there is a need to improve both the RF isolation and the electrostatic dissipation properties typically exhibited by plastics.

In accordance with the preferred embodiment, a thermosetting matrix system such as, but not limited to: synthetic elastomers, adhesives and sealants is blended with a non-conductive RF attenuating filler, such as carbonyl iron powder, to improve the RF attenuating properties of the mixture and ultimately the cover, (110). The preferred thermosetting matrix system, or binder is silicone rubber, as supplied by General Electric Co., Silicone Products Division., Waterford, N.Y. 12188. The preferred non-conductive RF attenuating filler is the previously suggested carbonyl iron powder.

In order to provide RF attenuation within the range of 1–60 GHz, a mixture of the thermosetting matrix system and 25–87% (percent) by weight loading of the non-conductive RF attenuating filler is required. It will be appreciated by those skilled in the art that mixtures having higher filler loading levels (70-87%) will exhibit more RF attenuation per unit length. It will also be appreciated that RF attenuation per unit length increases with frequency. For example, as measured in a wave guide test system, at maximum loading (87%) and 1 GHz, a mixture in accordance with the present invention can provide an RF attenuation of approximately 17 dB/inch. At 10 GHz the same mixture can provide an RF attenuation of approximately 170 dB/inch. Of note, 87% by weight loading is selected as the maximum loading because at levels higher than 87% by weight loading, the mixture tends to be to viscous to process.

When the mixture is reduced to 60% loading, an RF attenuation of approximately 7.1 dB/inch is expected at 1 GHz. At 60% loading and 10 GHz, an RF attenuation of approximately 142 dB/inch is anticipated.

From the foregoing, the inventors have determined that at lower frequencies (1-10 GHz) it is desirable to employ greater amounts of non-conductive filler since less attenuation per unit length is achieved. While the 87% by weight loading provides the maximum RF isolation, it unfortunately produces insertion loss characteristics which when employed with the present invention, adversely impact upon normal circuit (120) operation. Consequently, a balance must be struck between enhanced RF isolation and increased insertion loss, both of which are a function of the non-conductive filler loading level.

Advantageously, as the frequency of operation begins to rise, the loading level can be decreased since more attenuation per unit length is achieved at higher frequencies. In accordance with the preferred embodiment, a 51% (percent) by weight loading mixture consisting of 100 parts-by weight (pbw) silicone rubber and 104 pbw carbonyl iron powder is suggested. This mixture, when applied to the cover (110) including the walls (145), enables the cover (110), when fixed to the support structure (100), to provide RF attenuation within the cavity (185) up to approximately 20 GHz, while maintaining acceptable insertion loss levels.

Unfortunately, as the percentage of filler to thermosetting matrix system declines, the mixture takes on greater insulation properties. For example, the 87% (percent) by weight loading mixture, when applied to the cover (110), exhibits a volume resistivity of approximately $10^{10}$ ohms-cm, which provides marginal yet acceptable ESD protection. By comparison, the 51% (percent) by weight loading mixture exhibits such a high volume resistivity, $>10^{11}$ ohm-cm, that when applied to the cover (110), the cover will tend to store electrostatic energy. Thereafter, when fixed to the support structure (100), the stored electrostatic energy will discharge into the cavity (185) with catastrophic effects upon the ICs (120).

In accordance with the present invention, improved electrostatic dissipation is achieved by adding a conductive material filler to the previously disclosed mixture. The preferred conductive material filler is carbon black, as supplied by the Cabot Corporation, Edison, N.J. 08818. In accordance therewith, the mixture shall comprise 4 parts by weight carbon black in order to provide adequate ESD protection. By adequate the inventors means that the mixture provides a surface resistivity within a range between $10^5$-$10^{12}$ ohms/square or a volume resistivity within a range between $10^4$-$10^{10}$ ohms-cm, which are adequate to prevent the plastic cover (110) from storing electrostatic energy. Alternative conductive fillers include, but are not limited to stainless steel, copper, zinc, aluminum, nickel, silver, gold, graphite, iron and alloys thereof.

After blending, the mixture is applied to the cover (110) via spray, silk screen, compression mold or other suitable application techniques. In its completed form the cover (110) has three primary functions: 1) to provide an environmental seal which protects the MMIC chips (120) from deleterious effects; 2) to provide adequate ESD protection; and 3) provide zones of RF isolation (190) within the circuit carrier (200) cavity (185) thereby facilitating microwave applications.

What is claimed is:

1. A circuit carrier assembly comprising:
   a polymeric support structure having a base and surrounding sidewalls which form an internal cavity;
   a plurality of conductor paths disposed within said cavity; and
   a polymeric cover having a surface integrally fashioned to comprise wall members for making contact with conductor paths when the cavity is sealed by the cover, said cover layered with a surface material comprising:
   a thermosetting binder;
   a non-conductive RF absorbing filler comprising 25 to 87 percent by weight loading of the binder, such that the surface material absorbs RF energy within a range between 1-60 GHz; and
   a conductive filler comprising 1 to 4 percent by weight loading of the binder and the RF absorbing filler, such that the surface material has a surface resistivity of $10^5$-$10^{12}$ ohms/square.

2. The circuit carrier assembly of claim 1 further comprising a semiconductor device mounted within said cavity and connected to a conductor path.

3. The circuit carrier assembly of claim 2 wherein the semiconductor device is a GaAs integrated circuit capable of operating in the 1-60 GHz frequency range.

4. The circuit carrier assembly of claim 1 wherein the surrounding walls are integrally fashioned into the polymeric support structure.

5. The circuit carrier assembly of claim 1 wherein the polymeric support structure and the cover are made from a material selected from the group consisting of thermoplastics.

6. The circuit carrier assembly of claim 1 wherein the polymeric support structure and the cover are produced from thermoplastic fabrication processes.

7. The circuit carrier assembly of claim 1 wherein the wall members contact ground potential conductor paths within the cavity thereby forming zones of RF isolation.

8. The circuit carrier assembly of claim 1 wherein the polymeric support structure is layered with a conductive material.

9. The circuit carrier assembly of claim 1 wherein the thermosetting binder is selected from the group consisting of synthetic elastomers.

10. The circuit carrier assembly of claim 1 wherein the thermosetting binder is selected from the group consisting of adhesives and sealants.

11. The circuit carrier assembly of claim 1 wherein the thermosetting binder comprises silicone rubber.

12. The circuit carrier assembly of claim 1 wherein the non-conductive RF absorbing filler is carbonyl iron powder.

13. The circuit carrier assembly of claim 1 wherein the conductive filler is selected from the group consisting of: carbon black, metals, graphite and alloys thereof.

14. A circuit carrier assembly comprising:
- a polymeric support structure having a base and surrounding walls which form an internal cavity;
- a plurality of conductor paths disposed within the cavity;
- a semiconductor device mounted within the cavity and connected to a conductor path;
- a polymeric cover having a surface integrally fashioned to comprise wall members for making contact with ground potential conductor paths when the cavity is sealed by the cover, said cover layered with a surface material which absorbs RF energy within a range of 1–60 GHz and has a surface resistivity of $10^5$–$10^{12}$ ohms/square, said material comprising:
  - a thermosetting binder;
  - a non-conductive RF absorbing filler comprising 25 to 87 percent by weight loading of the binder; and
  - a conductive filler comprising 1 to 4 percent by weight loading of the binder and the RF absorbing filler.

* * * * *

UNITED STATES PATENT AND TRADEMARK OFFICE
CERTIFICATE OF CORRECTION

PATENT NO. : 5,185,654
DATED : February 9, 1993
INVENTOR(S) : Mark D. Mosher et al.

It is certified that error appears in the above-identified patent and that said Letters Patent is hereby corrected as shown below:

On title page, item [54] and col. 1, the title of invention should read:
--ELECTROSTATIC RF ABSORBANT CIRCUIT CARRIER ASSEMBLY--

Signed and Sealed this

Twenty-second Day of March, 1994

Attest:

BRUCE LEHMAN

Attesting Officer

Commissioner of Patents and Trademarks